United States Patent [19]

Lynch

[11] 4,001,490
[45] Jan. 4, 1977

[54] STRIP BUS BAR FOR TERMINAL POSTS
[75] Inventor: James Edward Lynch, Harrisburg, Pa.
[73] Assignee: AMP Incorporated, Harrisburg, Pa.
[22] Filed: July 1, 1975
[21] Appl. No.: 592,139

Related U.S. Application Data
[63] Continuation-in-part of Ser. No. 480,899, June 19, 1974, abandoned.
[52] U.S. Cl. .............................. 174/88 R; 339/19; 339/95 A; 339/275 R
[51] Int. Cl.² .................... H01R 31/08; H01R 5/04
[58] Field of Search ............ 174/88 R, 88 B, 72 B, 174/68.5, 71 R; 339/18 R, 18 B, 18 C, 19, 95 A, 222, 275 R, 275 C, 277 R, 277 C; 29/628, 629; 317/101 CC

[56] References Cited
UNITED STATES PATENTS

| | | | |
|---|---|---|---|
| 2,965,812 | 12/1960 | Bedford, Jr. | 317/101 CC |
| 3,022,480 | 2/1962 | Tiffany | 339/18 R |
| 3,488,620 | 1/1970 | Sullivan et al. | 339/19 |
| 3,582,864 | 6/1971 | Sullivan | 339/19 |
| 3,591,922 | 7/1971 | Pardee et al. | 174/68.5 X |
| 3,609,634 | 9/1971 | Hovnanian | 339/19 |
| 3,668,606 | 6/1972 | Walter | 339/19 |

Primary Examiner—Laramie E. Askin
Attorney, Agent, or Firm—William J. Keating; Donald W. Phillion

[57] ABSTRACT

An elongated bus bar is coated with solder and has a first plurality of large holes, and a second plurality of smaller holes formed therein. The holes are spaced apart predetermined distances which correspond to the distances between terminal posts upon which the bus bar is to be mounted. The larger holes are sufficiently large to remain completely free of the bus bar and also of the solder when it is melted. The smaller holes lie individually in sections of the bus bar which are bent in opposite rotational directions with respect to the main plane of the bus bar, and about the longitudinal axis of the bus bar, to provide an interference force fit between each of the smaller holes and the terminal posts inserted therein. These force fits oppose each other in different terminal post insertions because of the bending of the bus bar around the smaller holes. The bus bar is then heated, as by passing an electrical current therethrough, which flows the solder in and around only those terminal posts which are inserted through the smaller holes to make a good electrical and mechanical connection between the last-mentioned terminal posts and the bus bar.

10 Claims, 10 Drawing Figures

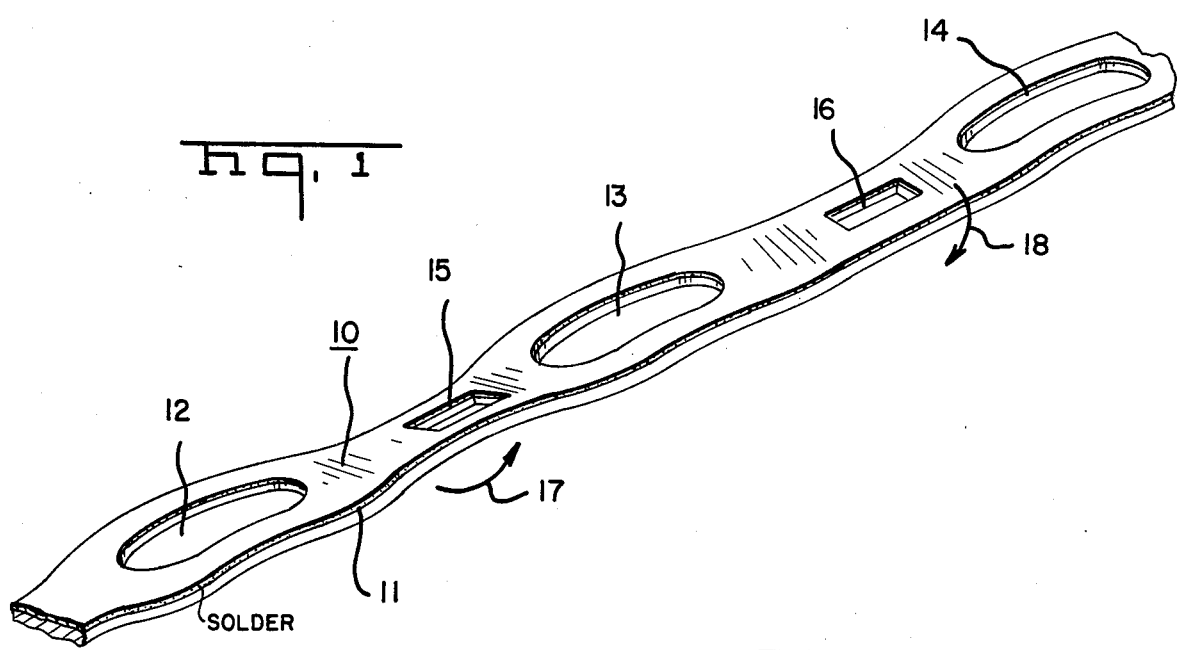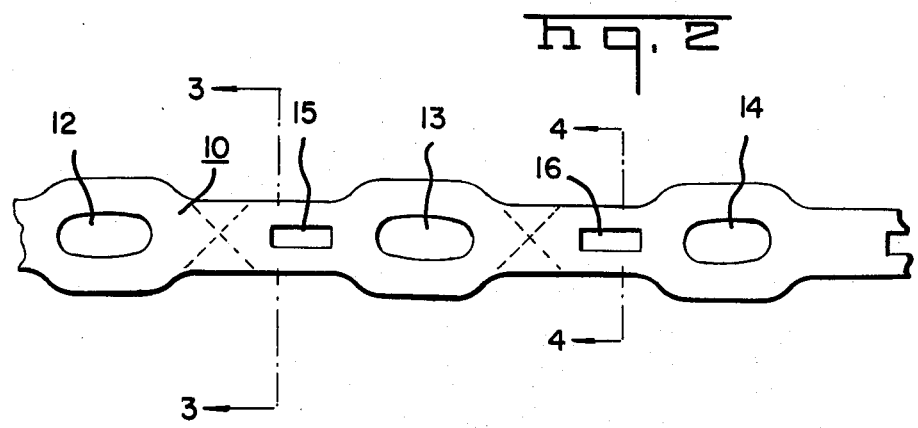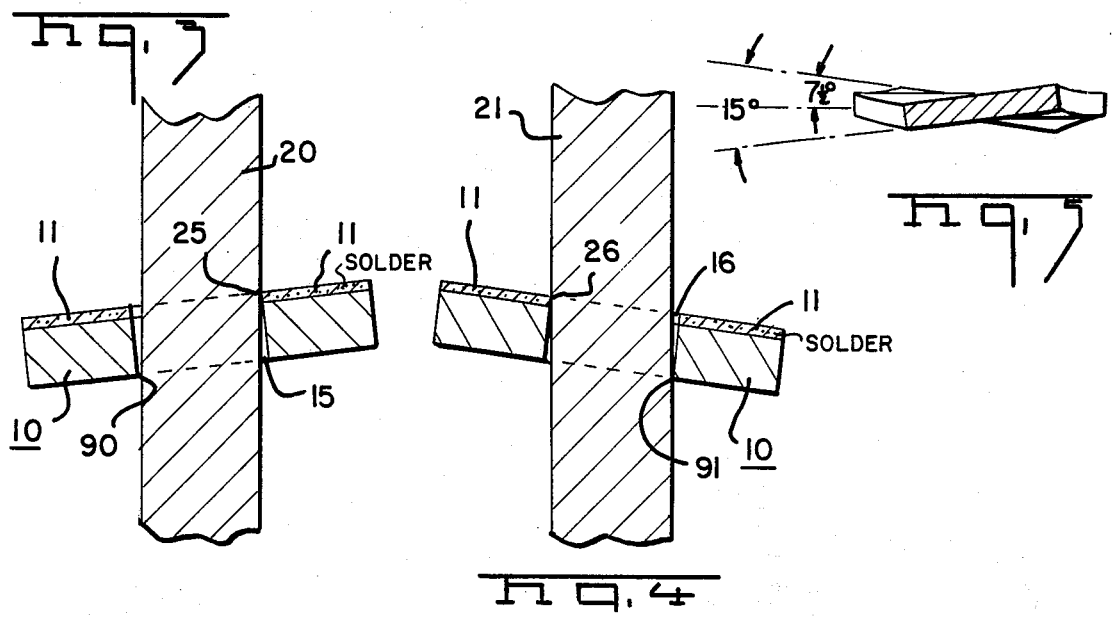

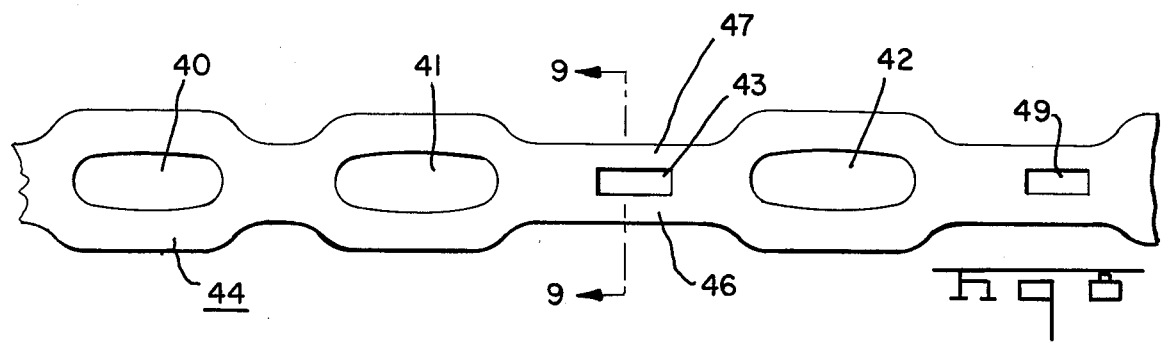
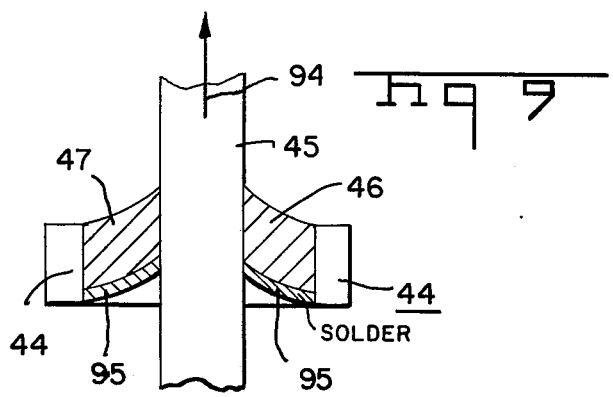
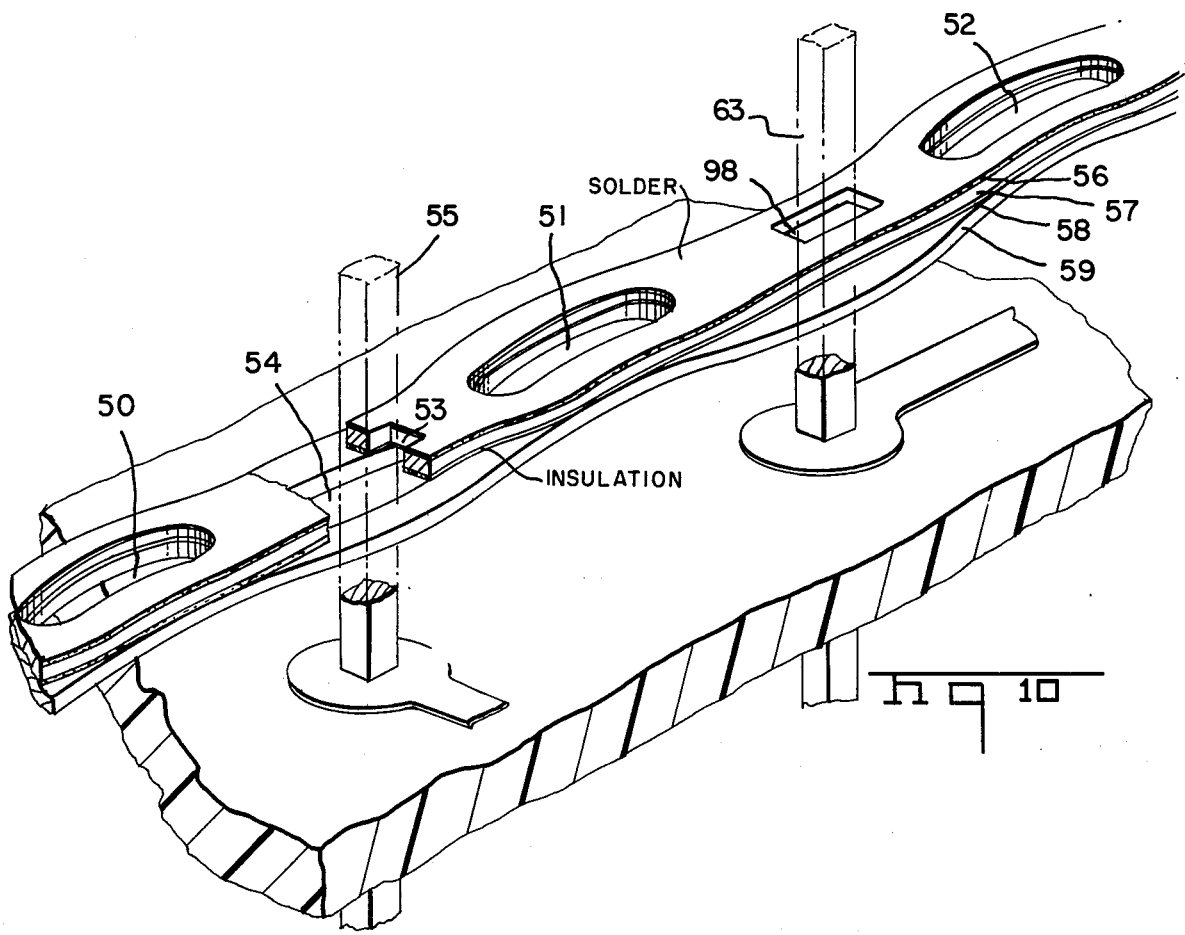

STRIP BUS BAR FOR TERMINAL POSTS

CROSS-REFERENCE TO RELATED APPLICATION

This application is a continuation-in-part of application Ser. No. 480,899 filed June 19, 1974, by James Edward Lynch and entitled "Strip Bus Bar For Terminal Posts.", now abandoned.

BACKGROUND OF THE INVENTION

This invention relates generally to strip type bus bars for use with terminal posts mounted on substrates such as printed circuit boards, and more particularly it relates to solder coated strip bus bars which can be mounted on a plurality of terminal posts extending from some substrate, such as a printed circuit board, and substantially simultaneously soldered to selected ones of said terminal posts.

In the current state of the electronic art, it is quite common to utilize terminal posts which extend through a printed circuit board. Often it is desirable to provide bus bars which fit over the terminal posts. In many cases it is desirable that the bus bar fit over certain selected ones of the terminal posts in a line of terminal posts, and to electrically by-pass other certain terminal posts in said line of terminal posts.

The types of bus bars used in the foregoing application can be divided generally into two categories. In the first category are strip bus bars which are formed of a spring-like metallic material and which are cold worked to form a plurality of individual, clip-like elements which, when pressed over the bus bar, exert a continuous force against the terminal posts due to the spring-like nature of the material, and thereby maintain electrical contact with the terminal posts. In order to maintain this continuous force against the terminal posts, the aforementioned type bus bar must usually be formed into a rather elaborate configuration having a number of fingers or wings. Further, the stiff, spring-like material is fairly expensive and relatively difficult to form. Still further, because of the stiffness of the material required, there is very little room for mismatch of spacing between the post gripping portions of the bus bar and the post-like terminals over which it fits. Therefore, alignment problems occur with more frequency than is desirable and are difficult to correct.

The other general form of bus bar involves a strip of metal which has holes or semi-holes of two sizes formed therein along the length thereof. These two sizes consist of large holes and small holes. The large holes are made sufficiently large to fit around the terminal posts without making any physical contact therewith, thereby maintaining electrical isolation from the posts. The smaller holes fit around selected terminal posts and are intended to ultimately make electrical contact therewith. Discrete, doughnut-shaped rings of solder are dropped over those terminal posts which are to be soldered to the bus bar; those terminal posts being the posts which extend through the smaller holes. The entire assembly is then heated and the solder rings melt to form a permanent electrical connection between the bus bar and the selected terminal posts. The terminal posts which pass through the larger holes remain electrically isolated from the bus bar.

One disadvantage of the last-mentioned type of bus bar is the expense of selectively dropping a ring of solder around each terminal post which is to be secured to the bus bar. Futhermore it is possible that a given terminal post is so perfectly aligned with the small hole in the bus bar that no physical contact at any point exists between the terminal post and the bus bar. Then, when the solder ring dropped over the terminal post is melted, it is possible that no connection will be made between the terminal post and the bus bar, or at best, only a partial connection will be made. In other words, none or insufficient solder will flow between the post and the bus bar to make a solid, permanent connection therebetween.

BRIEF STATEMENT OF THE INVENTION

A primary object of the present invention is to provide an inexpensive strip type bus bar for use with terminal posts mounted in printed circuit boards which is both easy to install and easy to solder.

A second purpose of the invention is to provide an inexpensive form of bus bar which is constructed to make contact with selected terminal posts in a row of posts and to selectively remain unconnected from other selected posts in said row of posts.

A third purpose of the invention is to provide a strip form of bus bar with a solder coating thereon which can be pressed over a row of post-like terminals secured, for example, in a printed circuit board, and which will make contact with selected ones of said posts by means of an interference fit and will electrically and mechanically by-pass other, second selected ones of said terminal posts, and which can then be heated to flow the solder coating between said first selected terminal posts and said bus bar and to leave the said second selected terminals electrically isolated from the bus bar.

A fourth aim of the invention is to provide an inexpensive and reliable having terminal posts mounted therein; which bus bar can easily be pressed over a row of terminal posts and which will then make a permanent electrical contact with only selected ones of said terminal posts when heated to a sufficient temperature to melt said solder coating.

A fifth purpose of the invention is the general improvement of bus bars usable with post-like terminals mounted in substrates, such as printed circuit boards.

In one form of the invention there is provided a strip bus bar which has a plurality of first and second sized holes formed therein, with the spacing between the holes coinciding closely with the spacings between the posts in the row of terminal posts upon which the bus bar is to be press-mounted. The size of each of said plurality of first holes is substantially larger than the cross-sectional area of the post terminals with which they coincide and the holes are positioned in sections of said bus bar which lie in a common first plane, preferably parallel to the plane of the substrate and perpendicular to the longitudinal axis of the post terminals. No contact occurs between the said bus bar and these said first terminal posts. The plurality of second sized holes lie in sections of said bus bar, alternate ones or more of which are bent in opposite directions to lie in planes which are not parallel with said plane of the larger holes.

Therefore the smaller holes lie in planes which are not perpendicular to the pins which pass therethrough. Consequently, diagonally positioned opposite edges of the inside wall of said smaller holes form an interference fit with the terminal post inserted therethrough.

Because of this physical gripping of the post by the edges of the small surrounding holes, the solder coating on the bus bar, when heated, will flow from the bus bar and in and around the post to form a permanent solder connection completely around the contained terminal post between the bus bar and the post to make a good electrical connection therebetween, and also to provide a firm mechanical support between bus bar and the post.

In another form of the invention the edges of the small holes which form an interference fit with the terminal post passing therethrough are bent either upwardly or downwardly to form a configuration similar to that of a Tinnerman nut which will function to provide spring pressure against a terminal post inserted therethrough. Because the portions of the bus bar forming the edges of the small hole are bent upwards (or downwards), the inner portions of the bus bar forming the walls of the hole are at an angle with the terminal post and the sharp edges of these walls will, in fact, dig into the terminal post to form an effective interference fit between the bus bar and the terminal post. Subsequently, when the bus bar is heated, for example, as by passing an electrical current therethrough, the solder coating on the bus bar will flow from the bus bar over the interference connection between the bus bar and the terminal post to create a solder connection which will fill the holes with solder to form a solder connection completely around the terminal post.

In still another form of the invention the strip bus bar is in fact comprised of two separate layers of conductive material which are separated by an insulating strip positioned therebetween. A first one of the strips consists of an array of small and large holes which either electrically by-pass or make an interference fit with each terminal post in a row of terminal posts, as described above. The other or second conductive layer consists entirely of large holes, which are either substantially concentric with the large holes in the first conductive layer or are substantially concentric with the smaller holes in the first conductive layer, so that when the bus bar is pressed over a row of terminal posts, the second bus bar layer will not make contact with any of the terminal posts. A solder coating is placed on the exposed surface of the first conductive layer of this doubled layer bus bar and functions to form a solder connection with those terminal posts which are inserted through the smaller holes of the bus bar, as described above.

Those sections of the bus bar which contain the smaller holes can either be bent in alternate directions, as described in connection with the first embodiment of the invention, or they can be bent upwards (or downwards) around the perimeter thereof to form a configuration similar to that of a Tinnerman nut, as described above.

In the last-mentioned form of the invention the second layer of the bus bar functions as a distributed capacitance with respect to the first layer of the bus bar, thereby minimizing the effect of current and voltage transients which might occur in electronic circuits employing ultra high or higher frequency components.

In accordance with a feature of the invention all of the various forms of the invention set forth above can have an edge profile which is undulating or generally sinusoidal in configuration so that the bus bar can be stretched or shortened in order to accommodate differences in spacing between the holes in the bus bar and the distances between the individual terminal posts over which the bus bar is to be pressed.

In accordance with another feature of the invention, the solder can be either coated upon the bus bar surface or it can be, in effect, glued upon the bus bar surface as by a flux containing some kind of bonding agent.

In accordance with still another feature of the invention, the solder can be selectively applied only around those sections of the bus bar surrounding the small holes which form the interference fit with the terminal posts, and with no solder being present on those portions of the bus bar surrounding the larger holes, and which do not make contact with the terminal posts.

In accordance with a fourth feature of the invention the configuration of the outer perimeter of the bus bar and the configuration of the large holes and the small holes can be such that the lineal resistance of the bus bar remains substantially constant after the bus bar has been installed and the solder coating reflowed to make contact with those terminal posts passing through the smaller holes. With this type of configuration of bus bar it follows that before the bus bar is heated by an electrical current passing therethrough, the cross-sectional area of those sections of the bus bar adjacent terminal posts is less than the cross-sectional area of the bus bar at other points. Thus, the resistance of the bus bar is greater in those areas adjacent the smaller holes. Because of this higher resistance, an electrical current flowing through the bus bar will heat those sections of the bus bar immediately adjacent the smaller holes more than the outer sections of the bus bar, thereby causing the solder around the smaller holes to melt first and flow around the terminal posts inserted therethrough. Furthermore, it is characteristic of solder flow that when heated it will flow from a cooler area to a hotter area. Thus, because of the greater heating of the area immediately around the smaller holes, the solder will be drawn from the surrounding cooler areas into and around the terminal posts inserted through the smaller holes.

The above mentioned and other objects and features of the invention will be more fully understood from the following detailed description thereof when read in conjunction with the drawings in which:

FIG. 1 is a perspective view of the invention in which alternate sections of the bus bar, defining the small holes having edges which form intereference connections with terminal posts inserted therethrough, are bent in opposite directions;

FIG. 2 is a top plan view of the struction of FIG. 1;

FIG. 3 is a sectional view of FIG. 2 taken along the plane 3—3;

FIG. 4 is a sectional view of FIG. 2 taken along the plane 4—4;

FIG. 5 is a diagram showing the relative planes in which alternate sections of the bus bar define the small interference holes;

FIG. 8 is a plan view of another form of the invention in which successive holes are not alternately large and small holes, and in which the sections of the bus bar immmediately surrounding and defining the smaller holes are bent upwards to form a kind of Tinnerman nut arrangement to receive and grip a terminal post inserted therethrough;

Figure 6:
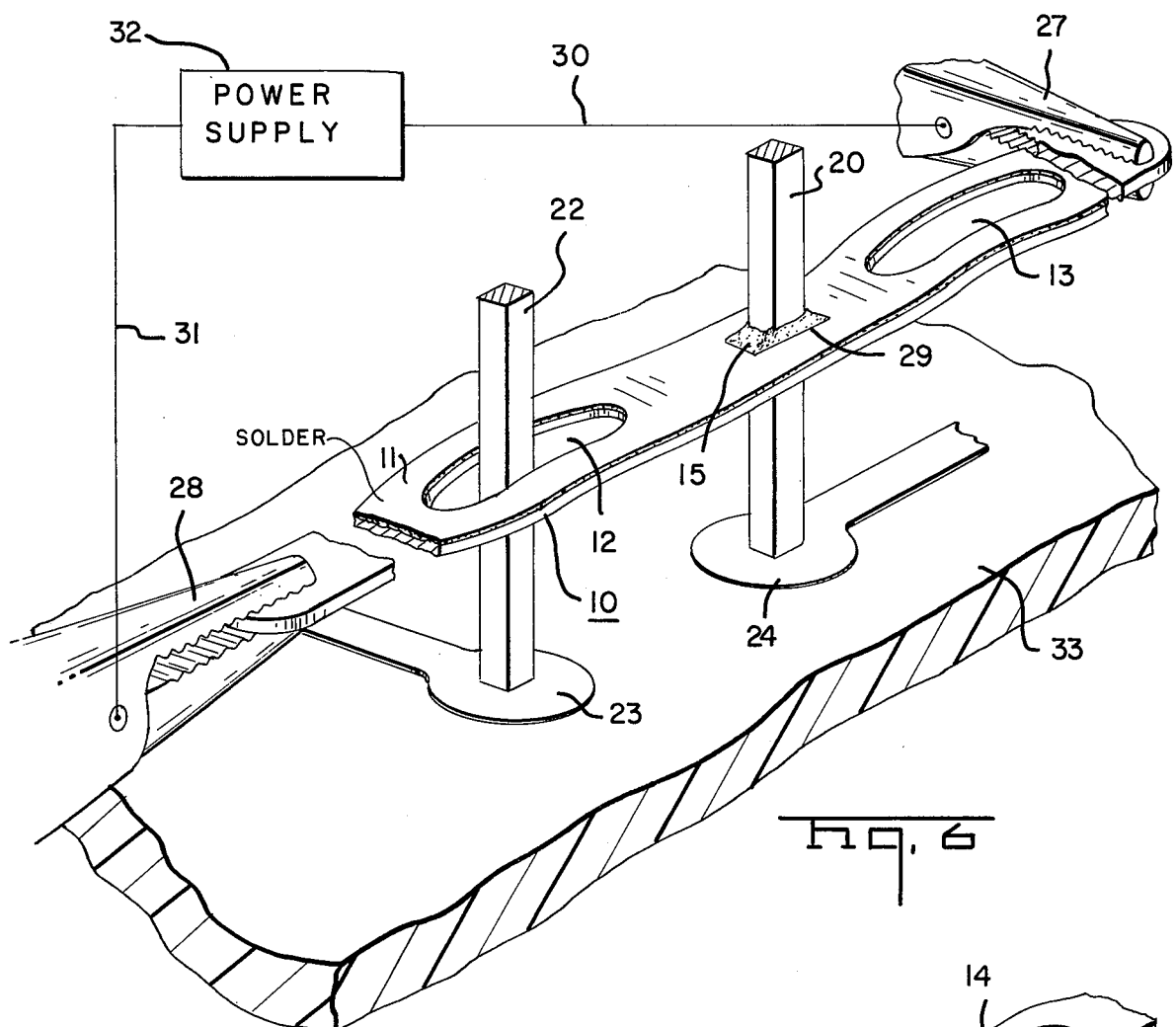
FIG. 6 is a perspective view illustrating the bus bar of FIG. 1 inserted over two terminal posts which are in turn secured within a printed circuit board, and further showing current source means for heating the bus bar to reflow the solder around the terminal posts inserted through the small holes in the bus bar.

FIG. 9 is a sectional view of FIG. 8 taken through the plane 9—9 and shows how the bus bar surrounding one of the small holes is bent upwards to form a configuration similar to that of a Tinnerman nut; and FIG. 10 is a perspective view of another form of the invention in which the bus bar consists of two layers of conductive material separated by a layer of electrically insulative material, such as polyethelene, which insulates the two metallic layers from each other, and in which one of the two metallic layers will not make contact with any of the terminal posts passing therethrough, but rather will function as a distributed capacitive plate coacting with the other conductive layer.

DEATILED DESCRIPTION OF THE INVENTION

Referring now to FIG. 1 the bus bar 10 has the general configuration shown therein, with large holes 12, 13 and 14 being therein at spaced intervals. Alternately positioned between the larger holes 12, 13 and 14 are the smaller holes 15 and 16.

The sections of the bus bar defining the large holes 12, 13 and 14 lie generally in the same plane, which is substantially normal to the terminal posts inserted therethrough when the bus bar is installed upon said terminal posts. The smaller holes, such as holes 15 and 16, however lie in portions of the bus bar which are bent in alternate directions at an angle with respect to the main plane of the bus bar, and around the longitudinal axis of the main bus bar. For example, the section of the bus bar surrounding the small hole 15 is bent in the general rotational direction of arrow 17. Similarly, the section of the bus bar 10 surrounding the small hole 16 is bent in a rotational manner in the opposite direction shown by the arrow 18. Thus, when bus bar 10 is inserted over a row of pins mounted in a printed circuit board, for example, the terminal posts which pass through the two smaller holes 15 and 16 will make an interference fit therewith in such a manner that the forces exerted by the sides of the small holes 15 and 16 against the terminal posts passing therethrough are in opposing directions, thereby reinforcing each other to maintain a constant force upon the two terminal posts passing therethrough.

On the other hand, the terminal posts passing through the larger holes 12, 13 and 14 pass through the nominal center thereof and do not make physical or electrical contact with the bus bar 10.

A solder coating 11 is formed on one side of bus bar 10 and, after installation of the bus bar 10 upon a row of terminal posts, the said bus bar 10 is heated and the solder 11 flows around the terminal posts inserted through the small holes 15 and 16.

It is to be noted in FIG. 1 that the profile, or edge view, of the bus bar forms a slight, undulating curve along the length thereof. Worded in another way, when bus bar 10 of FIG. 1 is viewed from the side it presents an undulating or generally sinusoidal configuration. This undulating configuration allows bus bar 10 to be lengthened or shortened slightly to accommodate for differences in spacing between the holes in bus bar 10 and the spacing between the terminal posts mounted on the printed circuit board, or over which the bus bar 10 is to be mounted.

Alternatively, the longitudinal centerline of bus bar 10 can be straight, but with the sections defining the small holes 15 and 16 being bent in opposite angular directions, as shown by arrows 17 and 18, and discussed hereinbefore.

Referring now to FIG. 2 there is shown a top view of the bus bar 10 of FIG. 1. It is to be noted that the large holes 12, 13 and 14 are generally oval in shape, thus eliminating as many sharp corners as possible in the structure to minimize abrupt changes in resistance along the bus bar 10 when used with circuits employing ultra-high or higher frequency components.

If the large holes 12, 13 and 14 were rectangular in shape, the cross-sectional area of bus bar 10 would vary considerably more along its length than is the case where the large holes 12, 13 and 14 are oval in shape, as shown in FIG. 2. Thus, more abrupt changes in impedance would occur. Also, as discussed above generally in connection with FIG. 1 it can be seen that the total cross-sectional area of bus bar 10 taken across one of the smaller holes 15 and 16 is less than the cross-sectional area of the bus bar at any other point. Thus, the resistance of the bus bar along those sections defining one of the small holes 15 and 16 is greater than at any other point in the bus bar. Accordingly, when electrical current is passed through bus bar 10 to melt the solder, the sections of the bus bar adjacent the smaller holes 15 and 16 will heat up more rapidly than any other portion of the bus bar. Since it is a characteristic of melting solder that it will flow from a cool area to a hotter area, the solder will tend to flow from the area surrounding large holes 12, 13 and 14 towards the hotter areas immediately surrounding the smaller holes 15 and 16, thereby ensuring an ample amount of solder to accumulate around the terminal posts inserted through the interference fit holes 15 and 16.

In FIGS. 3 and 4 there are shown sectional views of the bus bar of FIG. 1 taken along the planes 3—3 and 4—4, respectively. The principal purpose of FIGS. 3 and 4 is to illustrate how the sections of the bus bar are bent in opposite directions to provide counter forces against the terminal posts inserted therethrough.

Consider FIG. 3 first. A terminal post 20 is inserted through the small hole 15 in bus bar 10 which is bent in a counter-clockwise direction. The upper right hand edge 25 and the lower left hand edge 90 of bus bar 10 can be seen to dig into the terminal post 20. Thus, when solder coating 11 is heated, it will have a physical path between the bus bar and the terminal post 20 over which it can flow to surround the terminal post 20 and substantially completely fill in the small hole 15, thereby making an excellent electrical contact between post 20 and bus bar 10, as well as a strong mechanical bond therebetween.

In FIG. 4, the bus bar 10 is bent in the opposite angular direction so that the upper left hand edge 26 and the lower right hand edge 91 bite into the sides of the terminal post 21. When the solder coating 11 is melted it will fill the small hole 16 quite completely to provide good electrical and mechanical bonding between the bus bar 10 and terminal post 21.

Referring now to FIG. 5 the relative angles of the two sections taken along planes 3—3 and 4—4 can be seen. More specifically, it has been found that an angular relation between the two sections of approximately 15° provides good results, that is, a good interference fit between the small holes 15 and 16 and the terminal posts 20 and 21 inserted therethrough.

It is to be noted, however, that 15° is not the only angular relationship that will work effectively; 10°, 20° or even lesser or greater angular differences can be made to work with varying degrees of success. The important consideration is that there be an angular difference between the sections of bus bar 10 defining the smaller holes and that these angular deflections be in opposite directions to provide counter-forces against the terminal posts inserted therethrough. It is not absolutely necessary that the section of the bus bar containing every alternate one of the small holes be bent in opposite angular directions. As an alternative, for example, two consecutive bus bar sections containing small holes could be bent in one angular direction, and the next two bent in the opposite angular direction. Other combinations will also work suitably.

Referring now to FIG. 6 there is shown a perspective view of the bus bar 10 of FIG. 1 mounted upon a pair of terminal posts 22 and 20 which in turn are secured into a circuit board 33. The two terminal posts 22 and 20 are rigidly mounted in printed circuit board 33 and are connected to typical conductive paths, such as paths 23 and 24 on the surface of printed circuit board 33.

The terminal post 22 is shown as being inserted through a large hole 12 in bus bar 10, whereas the terminal post 20 is shown as being inserted through a small hole 15 in bus bar 10.

A pair of alligator clips 27 and 28 are shown connected to opposite ends of bus bar 10 and function to connect a power supply 32 to such bus bar through leads 30 and 31. The power supply 32 provides a current through bus bar 10 in a circuit extending from power supply 32, through lead 30, alligator clip 27, bus bar 10, alligator clip 28, lead 31 and then back to power supply 32. The current flowing through bus bar 10 is sufficient to melt the solder coating 11 on bus bar 10. Such melted solder will flow into the hole 15 and in and around the terminal post 20 to form a solder connection, identified by reference character 29, between bus bar 10 and terminal post 20.

Since terminal post 22 does not make any contact with bus bar 10, no such connection between terminal post 22 and bus bar 10 will occur.

Figure 7:
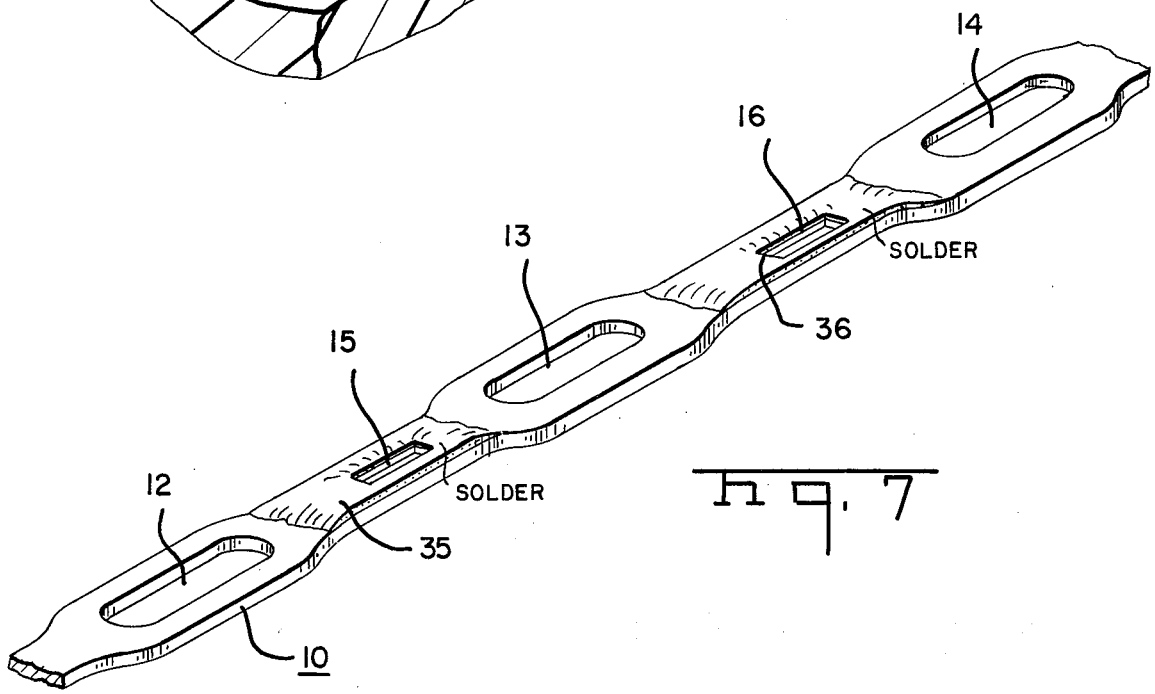
FIG. 7 is a perspective view of another form of the invention in which the solder is deposited or coated only around those sections of the bus bar which define one of the small holes.

Referring now to FIG. 7 there is shown another form of the invention in which the solder is originally positioned only in the vicinity around the smaller holes, such as solder deposits 35 and 36 around the smaller holes 15 and 16. No solder is located on the surface of the bus bar 10 immediately around the larger holes 12, 13 and 14.

The sections of bus bar 10 around the smaller holes 15 and 16 are bent angularly in opposite directions to provide an interference fit with terminal posts passing therethrough, as discussed in connection with FIGS. 1 through 6.

However, with the arrangement of FIG. 7, wherein all the solder is originally deposited around the smaller holes 15 and 16, when bus bar 10 is heated by passing an electrical current therethrough, the solder will already be very close to the small holes 15 and 16 and the terminal posts (not shown) passing therethrough, and will function to more quickly form the necessary solder connection between the terminal posts and the bus bar 10.

It is to be noted that once the solder connection between the terminal posts and the bus bar 10 is made, the resistance in these sections of the bus bar 10 decreases, thereby making even more uniform the resistance per unit of lineal length along the bus bar; a very desirable characteristic when used with ultra-higher frequency applications.

Referring now to FIGS. 8 and 9 there is shown still another form of the invention comprising a bus bar 44 with large holes 40, 41, 42 and small holes 43, 49 wherein the sections of the bus bar 44 around the smaller holes 43 and 49 are not bent in opposite angular directions, but are bent in an upward direction immediately around the perimeter of the hole to form of Tinnerman nut arrangement. More specifically, FIG. 9 is a sectional view taken along the plane 9—9 of FIG. 8. In FIG. 9 it can be seen that the sections 47 and 46 of bus bar 44 which are immediately adjacent the small hole 43 are bent upwardly. The post is inserted in the hole in the direction of the arrow 94, preferably, although it could be inserted in the other direction. If inserted in the direction of arrow 94, the solder coating 95 is drawn into the spacing between terminal post 45 and the inner wall of the small hole 43 of bus bar 44. Because of the configuration of the sections 47 and 46, a spring-like tension is maintained against terminal post 45, thereby producing an interference fit which will permit an easy flow of molten solder from the bus bar 44 to the terminal post 45 and in and around said terminal post 45 to completely fill hole 43 in which terminal post 45 is inserted.

Referring now to FIG. 10 there is shown still another form of the invention. In FIG. 10 there are two conductive layers identified by reference characters 57 and 59, which are separated by an insulating layer 58 which can be, for example, a material such as mylar. A solder coating 56 can be positioned on the upper surface of the upper conductive layer or bus bar 57. Both the upper conductive layer 57 and the lower conductive layer 59 can be secured to the insulating layer 58 by suitable means, such as non-conductive glue or an epoxy, for example. The positioning of the second conductive layer 59 in near proximity to an active portion of a circuit, such as bus bar 57 for example, forms a distributed capacitance. With the high frequencies employed in electronic circuits substantial differences in potential can exist at different points upon a conductor or bus bar at any given point in time. The proximity of a second conductive layer, which can be connected to a suitable reference potential, such as ground, coacts with the bus bar to create the capacitive effect which tends to minimize such differences in potential at different points in the common bus bar.

It is to be noted that the upper bus bar 57 consists of large and small holes, the large holes being identified by reference characters 50, 51 and 52 and the small holes by reference characters 53 and 98. Terminal posts passing through the large holes 50, 51 and 52 will not make any contact with either the upper or lower bus bars 57 and 59 or the insulation layer 58 therebetween. However, terminal posts which are inserted through small holes in the upper conductive layer or bus bar 57 will make contact with said upper bus bar 57. More specifically, terminal posts 55 and 63 will make interference fits with small holes 53 and 98 in the upper bus bar 57 so that when the solder layer 56 is melted, it will flow to said terminal posts 55 and 63 and fill the holes 53 and 98 in and around the terminal posts 55 and 63 to form a good electrical and mechanical connection therewith. The sections of the bus bar 57 immediately surrounding the small holes can be bent in opposite rotational directions, or alternatively, the edges of said small holes can be bent either upwardly or downwardly to form a configuration similar to that of a Tinnerman nut. The bus bar 59 is bent to conform to the shape of bus bar 57 in those areas which the two bus bars 57 and 59 share in common.

It is to be specifically noted however, that the lower bus bar 59 has no small holes therein; all of the holes in lower bus bar 59 being large holes 54 so that none of the terminal posts, such as terminal posts 55 or 63, can make contact with the lower bus bar 59.

To illustrate the foregoing, a portion of the solder layer 56, the upper bus bar 57 and the insulation layer 58 is broken away around the terminal post 55, exposing only the remaining lower bus bar 59. It can be seen that the lower bus bar 59 has a large hole 54 therein through which the terminal post 55 can pass without making contact therewith. Nor will contact be made between the lower bus bar 59 and the terminal post 55 when the solder coating 56 is caused to melt and flow, as by an electrical current passing therethrough.

It is to be noted that features and various forms of the invention shown and described herein can be combined in various manners. For example, in FIG. 10, the solder coating can be located only around the smaller holes on the upper bus bar 57. Further, the edge profile of the bus bar shown in FIG. 10 can be essentially flat or it can have the undulating or sinusoidal wave form which will permit lengthening or shortening thereof to accommodate differences in spacing between holes and the terminal posts over which the bus bar is to be pressed.

Also means can be provided to heat the bus bar other than an electrical current passing therethrough. For example, ultrasonic means can be used, or a controlled laser beam can be employed to melt the solder around the terminal posts passing through one of the smaller holes. Other suitable heating means will occur to those skilled in the art.

It is to be understood that the forms of the invention shown and described herein are but preferred embodiments thereof and that various changes can be made therein without departing from the spirit and scope of the invention.

What is claimed is:

1. A bus bar for electrically connecting together a plurality of terminal posts mounted upon a base in a predetermined pattern and comprising:
   a first strip of conductive material having a first and a second plurality of holes formed therein in a pattern which corresponds to the pattern of the terminal posts upon which said bus bar is to be mounted;
   each of said first plurality of holes being sufficiently large to provide complete electrical separation between the bus bar and the terminal posts to be passed therethrough and positioned in sections of said bus bar which all lie in substantially the same plane;
   each of said second holes being of a size and configuration to provide a physical interference contact with the posts to be passed therethrough;
   the sections of said bus bar immediately surrounding successive ones of said second holes being bent in opposite rotational directions primarily about an axis substantially coicident with the main longitudinal axis of said bus bar so that the edges of said second holes provide opposing torque forces upon the terminal posts when passed through said successive ones of said second holes.

2. A bus bar in accordance with claim 1 comprising a solder coating on at least those portions of the first side of said first strip of conductive material which immediately surrounds said second holes.

3. A bus bar in accordance with claim 1 further comprising:
   a second strip of conductive material;
   a layer of insulative material positioned between said first and second strips of conductive material to electrically insulate said first and second strips of conductive material from each other;
   said second strip of conductive material having a series of third holes therein which are arranged in a pattern corresponding to the pattern of said terminal posts over which said bus bar is to be mounted, with said third holes being sufficiently large to provide complete electrical separation between the bus bar and the terminal posts to be passed therethrough.

4. The combination of an elongated bus bar mounted over a plurality of conductive posts mounted upon a base in a predetermined pattern and comprising:
   a conductive strip comprising a first layer of low resistance metal having a first and second plurality of holes formed therein in a pattern which corresponds to the pattern of the terminal posts over which said bus bar is mounted;
   each of said first plurality of holes being sufficiently large to provide complete clearance between the bus bar and the posts passing therethrough and lying in sections of said bus bar having the same planar relation with said terminal posts;
   each of said second holes being of a size and configuration which provides a physical pressure contact with the terminal posts passing therethrough;
   said bus bar having a configuration in which the cross-sectional area of said bus bar along those portions of its length adjacent said second holes is smaller than the cross-sectional area of substantially all of the remaining portions of said bus bar;
   the sections of said bus bar immediately surrounding successive ones of said second holes being bent in opposite rotational directions with respect to the plane of those sections of said bus bar surrounding said first plurality of holes and primarily about an axis substantially coincident with the longitudinal axis of said bus bar providing opposing torque forces upon the terminal posts passing through said successive ones of said second holes.

5. A combination in accordance with claim 4 comprising a solder coating on at least those portions of the surface of said conductive strip surrounding said second holes.

6. A combination in accordance with claim 4 and further comprising:
   a second layer of low resistance metal;
   a layer of insulative material positioned between said first and second layers of low resistance metal to electrically insulate said first and second layers of low resistance metal from each other;
   said second layer of low resistance metal having a series of third holes therein arranged in a pattern which correspond to the pattern of said terminal posts over which said bus bar is mounted;

said third holes being sufficiently large to provide complete electrical separation between the bus bar and the terminal posts passing therethrough.

7. A bus bar for electrically connecting together a plurality of conductive posts mounted upon a base in a predetermined pattern and comprising:
- a substantially planar sheet of conductive metal having a first and second plurality of holes formed therein in a pattern which corresponds to the pattern of the posts over which said bus bar is to be mounted;
- each of said first plurality of holes being sufficiently large to provide complete electrical isolation between the bus bar and the terminal posts to be passed therethrough;
- each of said second holes being formed so that the edges thereof will provide a continuous spring-like pressure against the posts when passed therethrough; and
- a coating of solder formed on one surface of said planar sheet of conductive material in at least the areas surrounding said second holes.

8. A bus bar in accordance with claim 7 which further comprises:
- a second planar sheet of conductive metal;
- a layer of insulative material positioned between said first and second planar sheets of conductive metal to electrically insulate said first and second planar sheets of conductive metal from each other;
- said second planar sheet of conductive metal having a series of third holes therein arranged in the pattern corresponding to the pattern of said terminal posts over which said bus bar is to be mounted, with said third holes being sufficiently large to provide complete electrical isolation between the bus bar and the terminal posts to be passed therethrough.

9. A bus bar for electrically connecting together a plurality of terminal posts mounted upon a base in a predetermined pattern and comprising:
- a first layer of conductive material having a first and a second plurality of holes formed therein in a pattern which corresponds to the pattern of the terminal posts upon which said bus bar is to be mounted;
- each of said first plurality of holes being sufficiently large to provide complete electrical separation between the bus bar and the terminal posts to be passed therethrough;
- the sections of said bus bar immediately surrounding successive ones of said second holes being bent in opposite rotational directions primarily about an axis substantially coincident with the main longitudinal axis of said bus bar;
- each of said second holes in said rotationally bent sections of said bus bar being of a size and configuration to provide physical interference between the edges of said second holes and the terminal posts to be passed therethrough to create opposing torque forces upon said terminal posts to be passed therethrough.

10. A bus bar in accordance with claim 9 further comprising:
- a second layer of conductive mateial;
- a layer of insulative material positioned between said first and second layers of conductive material to electrically insulate said first and second layers of conductive material from each other;
- said second layer of conductive material having a series of third holes therein which are arranged in a pattern corresponding to the pattern of said terminal posts over which said bus bar is to be mounted;
- said third holes being sufficiently large to provide complete electrical separation between the bus bar and the terminal posts to be passed therethrough.

* * * * *